(12) United States Patent
Ewanchuk et al.

(10) Patent No.: US 12,063,763 B2
(45) Date of Patent: Aug. 13, 2024

(54) COOLING IN CONDUCTORS FOR CHIPS

(71) Applicant: Hamilton Sundstrand Corporation, Charlotte, NC (US)

(72) Inventors: Jeffrey Ewanchuk, Manchester, CT (US); Kimberly Rae Saviers, Glastonbury, CT (US); Ram Ranjan, West Hartford, CT (US); Ross Wilcoxon, Cedar Rapids, IA (US); Haley Steffen, Cedar Rapids, IA (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 402 days.

(21) Appl. No.: 17/474,802

(22) Filed: Sep. 14, 2021

(65) Prior Publication Data

US 2023/0077598 A1    Mar. 16, 2023

(51) Int. Cl.
| | | |
|---|---|---|
| H05K 7/20 | (2006.01) | |
| H01L 23/427 | (2006.01) | |
| H01L 23/473 | (2006.01) | |

(52) U.S. Cl.
CPC ......... *H05K 7/20936* (2013.01); *H05K 7/209* (2013.01); *H01L 23/427* (2013.01); *H01L 23/473* (2013.01); *H05K 7/20254* (2013.01); *H05K 7/20336* (2013.01); *H05K 7/20927* (2013.01)

(58) Field of Classification Search
CPC ............................................. H01L 23/34–4735
See application file for complete search history.

(56) References Cited

U.S. PATENT DOCUMENTS

| | | | |
|---|---|---|---|
| 5,801,442 A | 9/1998 | Hamilton et al. | |
| 7,538,425 B2 | 5/2009 | Myers et al. | |
| 7,795,726 B2 * | 9/2010 | Myers | H01L 23/473 |
| | | | 257/713 |
| 8,929,071 B2 | 1/2015 | Beaupre et al. | |
| 10,283,436 B2 | 5/2019 | Schuderer et al. | |
| 10,388,590 B1 * | 8/2019 | Joshi | H01L 23/473 |
| 10,438,869 B2 | 10/2019 | Stra er | |
| 10,461,017 B2 | 10/2019 | Grassmann et al. | |
| 10,615,100 B2 * | 4/2020 | Fukuoka | H01L 24/32 |
| 10,971,431 B2 * | 4/2021 | Yamauchi | H02M 7/003 |
| 11,652,020 B2 * | 5/2023 | Chiu | H01L 23/4006 |
| | | | 361/783 |

(Continued)

FOREIGN PATENT DOCUMENTS

| | | |
|---|---|---|
| EP | 901166 B1 | 11/2001 |
| EP | 3147941 A1 | 3/2017 |

Primary Examiner — Zachary Pape
Assistant Examiner — Steven Ngo

(57) ABSTRACT

A system for cooling a power component includes a first metal layer. A cooling layer having a first surface is in contact with a surface of the first metal layer. A second metal layer is included having a surface in contact with a second surface of the cooling layer opposite the first metal layer. The cooling layer is of a material different from that of the first metal layer and that of the second metal layer. A plurality of cooling features are embedded in the material of the cooling layer. The cooling channels are spaced apart from both the first metal layer and the second metal layer by the material of the cooling layer. An electrically conductive path connects the first metal plate to the second metal plate.

15 Claims, 3 Drawing Sheets

(56) References Cited

U.S. PATENT DOCUMENTS

| | | | |
|---|---|---|---|
| 2001/0050165 A1* | 12/2001 | Cheung | H01L 23/427 |
| | | | 165/104.34 |
| 2008/0272485 A1* | 11/2008 | Myers | H01L 25/117 |
| | | | 257/E23.098 |
| 2012/0287577 A1 | 11/2012 | Sevakivi et al. | |
| 2020/0126890 A1* | 4/2020 | Singh | H01L 23/427 |
| 2020/0357721 A1* | 11/2020 | Sankman | H01L 25/0655 |
| 2021/0233828 A1* | 7/2021 | Meyer | H01L 23/15 |
| 2021/0242144 A1* | 8/2021 | Moriwaki | H01L 23/3677 |
| 2022/0310481 A1* | 9/2022 | Alvi | H05K 7/20927 |

* cited by examiner

COOLING IN CONDUCTORS FOR CHIPS

BACKGROUND

1. Field

The present disclosure relates to cooling electrical conductors of chips, and more particularly to cooling in conductors for chip on chip 3-dimensional power packages and the like.

2. Description of Related Art

Power module packaging contains power semiconductor dies and their substrate which is the thermo-mechanical interface with the rest of the power converter. As the packaging is reduced in size under continuous design pressure, the thermal management of both the semiconductors and the conductors becomes challenging. Requirements for high power dissipation, high reliability and the need to be able to reject heat to high temperatures are the reasons for the challenge.

The conventional techniques have been considered satisfactory for their intended purpose. However, there is an ever present need for improved systems and methods for cooling in chips such as power semiconductor dies. This disclosure provides a solution for this need.

SUMMARY

A system for cooling a power component includes a first metal layer. A cooling layer having a first surface is in contact with a surface of the first metal layer. A second metal layer is included having a surface in contact with a second surface of the cooling layer opposite the first metal layer. The cooling layer can be of a material different from that of the first metal layer and that of the second metal layer. A plurality of cooling channels are embedded in the material of the cooling layer. The cooling channels are spaced apart from both the first metal layer and the second metal layer by the material of the cooling layer. An electrically conductive path connects the first metal plate to the second metal plate.

The material of the cooling layer can be metallic. The material of the cooling layer can be molybdenum or its composites or alloys with other metals. The cooling layer can be an assembly of two separate layers, wherein the cooling channels are defined only part way through one or both of the separate layers. Each of the cooling channels can include an epoxy encased heat pipe electrically insulated from the material of the cooling layer.

The first metal layer, second metal layer, and cooling layer can be a direct bonded copper (DBC) wherein the cooling layer is of a ceramic material. A via can be formed through the cooling layer to electrically connect the first metal layer to the second metal layer, wherein the via is spaced apart from the cooling channels by the material of the cooling layer.

An assembly of power components can be bonded to a surface of the first metal layer opposite the cooling layer. The power components can include dies integrated into a substrate with copper plating on one side of the substrate in electrical communication with the dies, wherein the copper plating is in contact with the first metal layer. At least one of vertical interconnects, lateral interconnects, and/or inductors can be formed on a side of the substrate and dies opposite the copper plating.

A second conductor substrate with embedded cooling channels can include a first metal layer, second metal layer, and cooling layer as in the first conductor substrate with embedded cooling channels. The second metal layer of the second conductor substrate can be in electrical contact with the at least one of vertical interconnects, lateral interconnects, and/or inductors that are formed on a side of the substrate and dies opposite the copper plating.

A second assembly of power components can include dies integrated into a substrate with copper plating on one side of the substrate in electrical communication with the dies as in the first assembly of power components. The copper plating of the second assembly of power components can be in contact with the first metal layer of the second conductor substrate.

A third conductor substrate with embedded cooling channels can include a first metal layer, second metal layer, and cooling layer as in the first conductor substrate with embedded cooling channels. The second metal layer of the third conductor substrate can be in electrical contact with the at least one of vertical interconnects, lateral interconnects, and/or inductors on a side of the substrate and dies opposite the copper plating of the second assembly of power components.

For the first assembly of power components each of the dies can include a respective source, a respective drain, and a respective gate. The drains can be on a side of the dies electrically connected to the copper plating. The gates and sources of the dies can be on a side of the dies opposite the copper plating electrically connected to the second metal layer of the second conductor substrate.

For the second assembly of power components each of the dies can include a respective source, a respective drain, and a respective gate. The drains can be on a side of the dies electrically connected to the copper plating. The gates and sources of the dies can be on a side of the dies opposite the copper plating electrically connected to the second metal layer of the third conductor substrate.

The dies of the first and second assemblies of power components can be electrically connected to form a boost converter circuit. The dies of the first assembly of power components can form a first switching component (SI) of the boost converter circuit. The dies of the second assembly of power components can form a second switching component (SU) of the boost converter circuit.

A gate driver input contact can be electrically connected to the gates of the first assembly of power components. A ground reference contact can be electrically connected to provide a gate driver a reference at the same potential as the MOSFET of the die. A gate driver power supply contact can be electrically connected to supply voltage to a gate driver chip. The first conductor substrate can be connected as a voltage out contact for the boost converter circuit. The second conductor substrate can be connected as a voltage in contact for the boost converter circuit. The third conductor substrate can be connected as a ground contact for the boost converter circuit.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
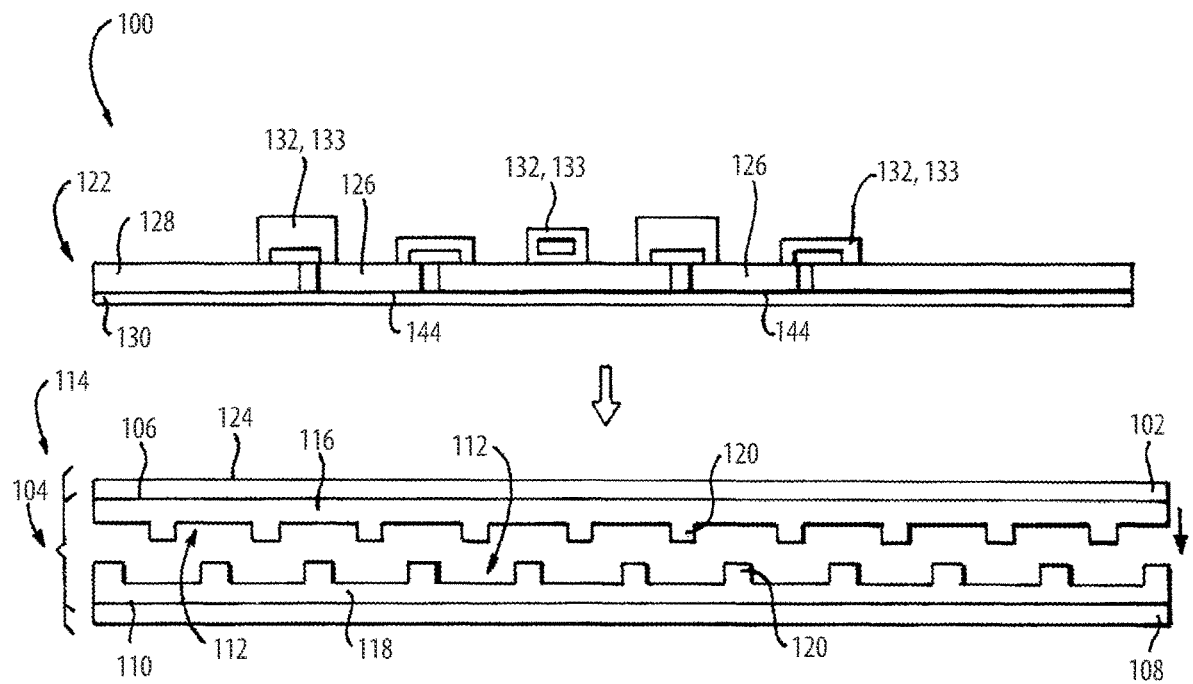
FIG. 1 is a schematic exploded cross-sectional side elevation view of a portion of an embodiment of a system constructed in accordance with the present disclosure, the two components of the cooling layer before they are joined together, and showing the assembly of power components before joining to the conductor substrate.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2-7, as will be described. The systems and methods described herein can be used to provide embedded cooling in circuit components.

The system 100 for cooling a power component includes a first metal layer 102. A cooling layer 104 having a first surface 106 is in contact with a surface of the first metal layer 102. A second metal layer 108 is included having a surface in contact with a second surface 110 of the cooling layer 104 opposite the first metal layer 102.

Figure 2:
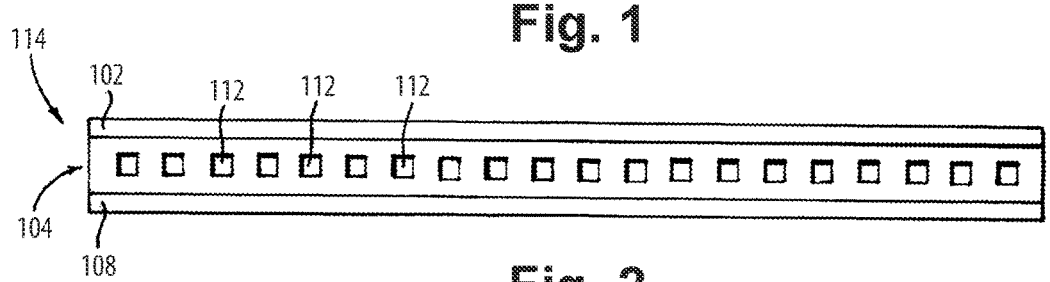
FIG. 2 is a schematic cross-sectional side elevation view of the conductor substrate of FIG. 1, showing the two components of the cooling layer assembled together to form embedded cooling channels.

Referring now to FIG. 2, a plurality of cooling features, namely cooling channels 112 are embedded in the material of the cooling layer 104. The cooling channels 112 are spaced apart from both the first metal layer 102 and the second metal layer 108 by the material of the cooling layer 104, so a cooling fluid flowing through the coolant channels 112 will not contact either of the metal layers 102, 108. The cooling layer 104 is of a material different from that of the first metal layer 102 and that of the second metal layer 108. An electrically conductive path connects the first metal plate 102 to the second metal plate 108. In FIGS. 1-2, the embodiment shown has a molybdenum cooling layer 104, and the first and second metal layers 102, 108 are both of copper. Molybdenum or its composites or alloys with other metals can be used, as can any suitable metallic material, for the cooling layer 104. The electrical path from the first metal layer 102 to the second metal layer 108 is through the electrically conductive cooling layer 104 of molybdenum.

Since the three layers 102, 104, 108 are to serve as a conductor substrate 114, a dielectric cooling fluid should be used in the coolant channels 112 to avoid short circuiting the system 100. As shown in the exploded view of FIG. 1, the cooling layer 104 is an assembly of two separate layers 116, 118. The cooling channels 112 can be etched or otherwise formed only part way through one or both of the separate layers 116, 118, leaving lands 120. The lands 120 form separators between the respective channels 112 when the two separate layers 116, 118 are joined together as shown in FIG. 2.

Figure 3:
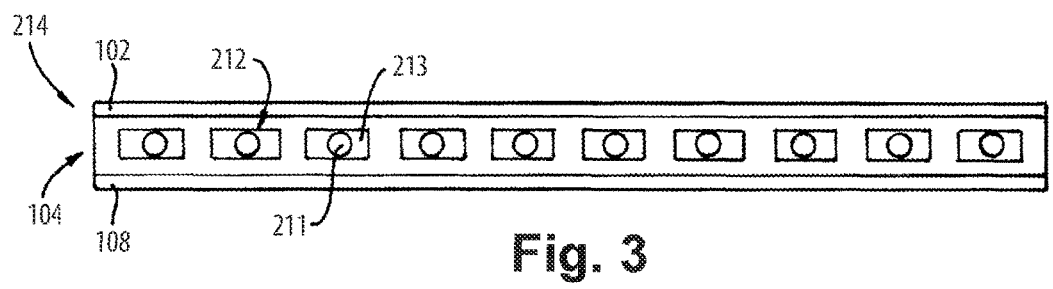
FIG. 3 is a schematic cross-sectional side elevation view of another example of a conductor substrate in accordance with the present disclosure, showing embedded heat pipes.

With reference now to FIG. 3, if a metallic material is used for the cooling layer 104, it is possible to use heat pipes encased in epoxy in lieu of dielectric coolant. In the conductor substrate 214, there are copper first and second layers 102, 108, and a metallic cooling layer much as described above with reference to FIG. 2. However, in lieu of cooling channels that are open for flow of coolant, each channel 212 includes a heat pipe 211 embedded in epoxy 213. The epoxy 213 maintains electrical isolation of the heat pipes 211 from the coolant layer 104, while maintaining thermal contact of the heat pipes 211 through the epoxy to cool the conductor substrate 214. While a heat pipe 211 is shown embedded in the epoxy 213, it is also contemplated that the heat pipe 211 can be a heat pipe channel embedded in the epoxy 213. This can accommodate U-shaped heat pipes that are intertwined in the layer, or oscillating heat pipes (OHPs) in the heat pipe channels 211. The OHP can also be configured as its own metal layer with a separate insulating layer above and below the OHP, for example, where the OHP and its insulating layers replace the cooling layer 304, which is described below. Hermetically sealed heat pipes could be planar OHP or conventional capillary-wick vapor chambers in a low-coefficient of thermal expansion material such as Molybdenum. Coolant layers 104 in case of heat pipes can be located away from the package electrical connections in the lateral directions. The coolant may be outside of the package in this case.

Figure 4:
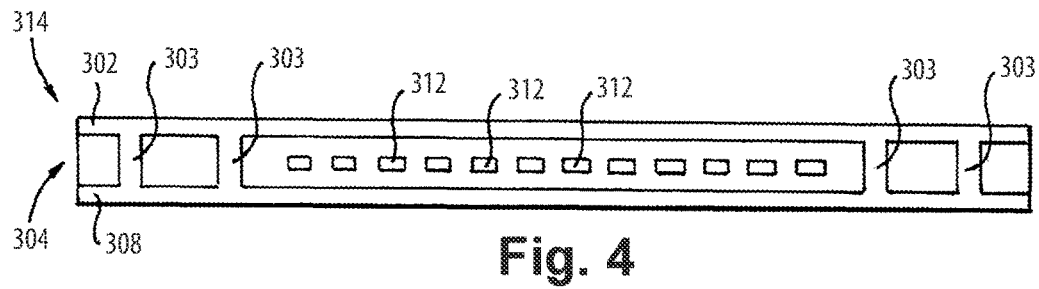
FIG. 4 is a schematic cross-sectional side elevation view of another example of a conductor substrate in accordance with the present disclosure, showing cooling channels embedded in a ceramic material.

With reference now to FIG. 4, another embodiment of a conductor substrate 314 includes a first metal layer 302, a ceramic cooling layer 304, and a second metal layer 308 stacked together. The cooling channels 312 are electrically insulated from the first and second metal layers 302, 308 so it is not necessary to use a dielectric cooling fluid to cool the conductor substrate 314—any suitable coolant fluid can be used. Coolants for this disclosure can be single-phase or two-phase coolants. The first metal layer 302, second metal layer 308, and cooling layer 304 are a direct bonded copper (DBC). One or more vias 303 are formed through the cooling layer 304, electrically connecting the first metal layer 302 to the second metal layer 308. The vias 303 are all spaced apart, i.e. laterally as oriented in FIG. 4, from the cooling channels 312 by the material of the cooling layer 304. So if the ceramic material of the cooling layer 304 is sufficiently electrically insulative, it is not necessary to use a dielectric coolant fluid in the cooling channels 312.

Figure 5:
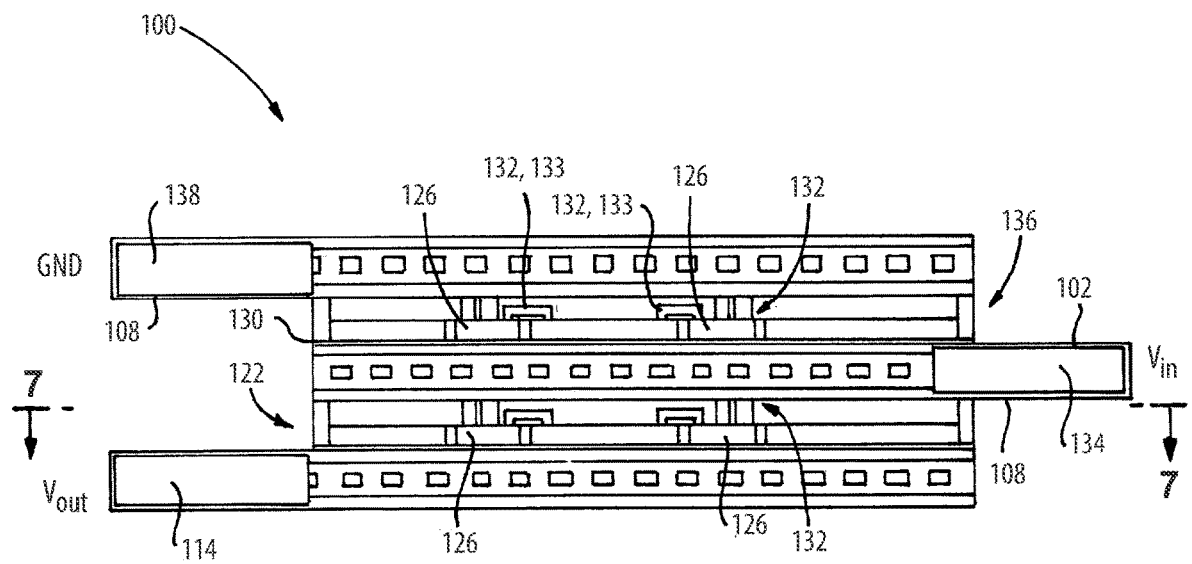
FIG. 5 is a schematic cross-sectional side-elevation view the system of FIG. 1, showing a plurality of the conductive substrates and assemblies of power components of FIG. 1 stacked together to form a circuit.

Referring again to FIG. 1, which shows a portion of the system of FIG. 5, the power components of the assembly 122 include dies 126 that are integrated into a substrate 128 with copper plating 130 on one side of the substrate 128 in electrical communication with the dies 126. The copper plating 130 is added as part of the process of attaching the dies 126 within the substrate 128. The electrical connections 133 are fabricated onto the substrate 128. Then the assembly 122 of power components is bonded to a surface 124 of the first metal layer 102 opposite the cooling layer 104. The copper plating 130 is in contact with the first metal layer 102. The components 132 of are formed on a side of the substrate 102 and dies 126 opposite from the copper plating 130. The components 132 can include electrical connections 133 such as vertical interconnects and lateral interconnects, as well as other components such as inductors, and/or the like.

With reference now to FIG. 5, a second conductor substrate 134 constructed in the same manner as the first conductor substrate 114 can be included in the stack of system 100. The second metal layer 108 of the second conductor substrate 134 is in electrical contact with the components 132. A second assembly 136 of power components similar to the first assembly 122 of power components. The copper plating 130 of the second assembly 136 of power components is in contact with the first metal layer 102 of the second conductor substrate 134.

A third conductor substrate 138 with embedded cooling channels is constructed in the same manner as the first and second conductor substrates 114, 134. The second metal layer 108 of the third conductor substrate 138 is in electrical contact with the components 132 of the second assembly 136 of power components. It is also contemplated that the third conductor substrate 138 does not necessarily need cooling features. It can be fully metal, for example.

Figure 7:
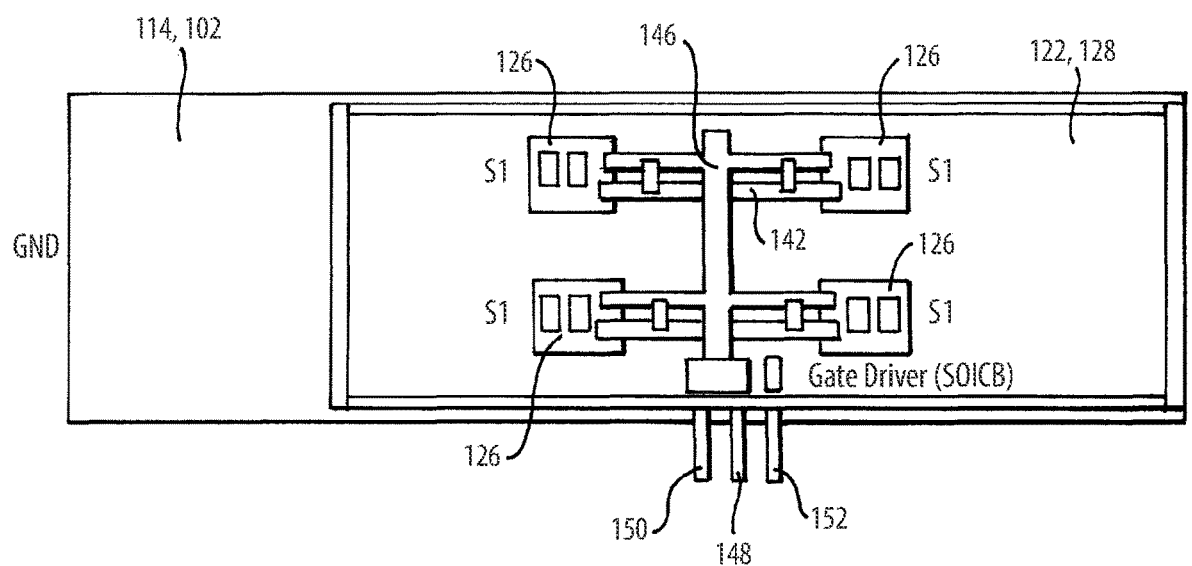
FIG. 7 is a schematic plan view of the stack of FIG. 5, showing the connections of four of the dies.

Referring to FIGS. 5 and 7 together, the dies 126 of the first and second assemblies 122, 136 of power components are electrically connected to form a boost converter circuit 140. The dies 126 of the first assembly 122 of power components form a first switching component (SI) of the boost converter circuit 140. The dies 126 of the second assembly 136 of power components form a second switching component (SU) of the boost converter circuit 140.

Referring again to FIGS. 5-6, the first conductor substrate 114 is connected as voltage out contact for the boost converter circuit 140. The second conductor substrate 134 is connected as a voltage in ($V_{in}$) contact for the boost converter circuit 140. The third conductor substrate 138 is connected as a ground contact for the boost converter circuit 140.

Figure 6:
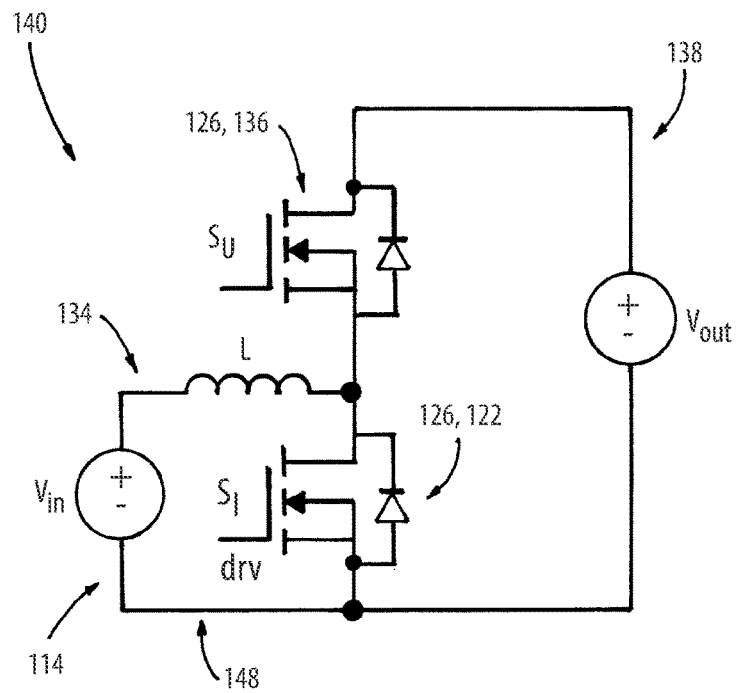
FIG. 6 is a schematic view of the circuit of FIG. 5.

With reference now to FIG. 7, for the first assembly 122 of power components each of the dies 126 includes a respective source 142, a respective drain 144 (labeled in FIG. 1), and a respective gate 146. The drains 144 are on a side of the dies 126 electrically connected to the copper plating 130 as shown in FIG. 1 and are electrically connected to the ground node as indicated in FIG. 6, which is the first conductor contact 114. The gates 146 and sources 142 of the dies 126 are on a side of the dies 126 opposite the copper plating 130 (labeled in FIG. 1) and electrically connected to the second metal layer 108 of the second conductor substrate 134, which serves as a $V_{in}$ node for the boost converter circuit 140 of FIG. 6. While not shown in its own figures, the respective dies 126 of the second assembly 136 have gates, drains, and sources similar to those in the first assembly 122 as shown in FIG. 7, but are respectively connected to the second and third conductor substrates 134 and 138 instead of to the first and second conductor substrates 114, 134, respectively.

With continued reference to FIG. 7, a gate driver input contact 148 (dvr) is electrically connected to the gates 146 of the first assembly 122 of power components. A ground reference contact 150 (gnd) is electrically connected to the die 126 and the boost converter circuit 140 (of FIG. 6) to provide a reference to the gate driver chip (labeled Gate driver (SOIC8) in FIG. 7) that is at the same potential as the source of the MOSFET of the dies 126. A gate driver power supply contact 152 (pwr) is electrically connected to supply voltage, e.g. 15 volts, to a gate driver chip, labeled Gate diver (SOIC8) in FIG. 7.

It is contemplated that any or all of the conductor substrates 114, 134, 138 can be replaced by either of the conductor substrates 214, 314 of FIGS. 3-4 in the stack of system 100 of FIG. 5. It is also contemplated that cooling conductors such as disclosed herein can be used for cooling in any suitable stack of components for any suitable circuit configuration. For embodiments using cooling fluids, the cooling can be provided by connecting the coolant channels, e.g. coolant channels 112 of FIG. 2, in fluid communication with any suitable heat exchanger, heat sink, pump, or the like. Similarly, the heat pipes 211 of FIG. 3 can be connected in thermal communication with any suitable heat sink to provide cooling.

The systems and method disclosed herein employ a stacked power chip on chip concept with near die cooling. The cooling channels are embedded within the conductor near to the power semiconductor so as to achieve the merits of active cooling for both the power devices and the conductors within the power module package. The high thermal dissipation capability enables the package to be vertically integrated, and the cooling channels are formed in such a way to reduce or minimize the thermomechanical stress in the power module package. Further, electrical isolation can be achieved with either dielectric coolant, ceramic based substrate (isolated channels) with copper vias and/or epoxy coated heat pipe channels. The vertical integration can minimize parasitic inductance, which can enable better efficiency. The vertical integration can minimize the parasitic inductance, and capacitance to ground. Higher efficiency is enabled thanks to the faster possible switching speeds (due to the lower parasitic impedances) from the semiconductor chips, thereby reducing the switching losses.

True 3-dimensional stacking of vertical power semiconductors is enabled without derating of their power processing capability. The copper thicknesses required to handle the current conduction within the power module is reduced or minimized due to the direct cooling, thereby increasing or maximizing the current density with the power module. The lower thermal constraints allow designers to reduce or minimize the material cost, or increase/maximize the lifetime of the power module.

The methods and systems of the present disclosure, as described above and shown in the drawings, provide embedded cooling in circuit components. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system for cooling a power component comprising:
a first metal layer;
a cooling layer having a first surface in contact with a surface of the first metal layer; and
a second metal layer having a surface in contact with a second surface of the cooling layer opposite the first metal layer,
wherein a plurality of cooling channels are embedded in a material of the cooling layer, wherein the plurality of cooling channels are spaced apart from both the first metal layer and the second metal layer by the material of the cooling layer, wherein an electrically conductive path connects the first metal layer to the second metal layer, further comprising an assembly of power components bonded to a surface of the first metal layer opposite the cooling layer, wherein the assembly of power components include dies integrated into a substrate with a copper plating on one side of the substrate in electrical communication with the dies, wherein the copper plating is in contact with the first metal layer, wherein at least one of vertical interconnects, lateral interconnects, and/or inductors is/are on a side of the substrate and the dies opposite the copper plating;

wherein the first metal layer, second metal layer, and cooling layer form a first conductor substrate with embedded cooling channels and further comprising:

a second conductor substrate with embedded cooling channels including a first metal layer, second metal layer, and cooling layer as in the first conductor substrate with embedded cooling channels, wherein the second metal layer of the second conductor substrate is in electrical contact with the at least one of vertical interconnects, lateral interconnects, and/or inductors on the side of the substrate and dies opposite the copper plating of the assembly of power components;

wherein the assembly of power components is a first assembly of power components and further comprising:

a second assembly of power components including dies integrated into a substrate with a copper plating on one side of the substrate in electrical communication with the dies as in the first assembly of power components, wherein the copper plating of the second assembly of power components is in contact with the first metal layer of the second conductor substrate; and a third conductor substrate with embedded cooling channels including a first metal layer, a second metal layer, and a cooling layer as in the first conductor substrate with embedded cooling channels, wherein the second metal layer of the third conductor substrate is in electrical contact with at least one of vertical interconnects, lateral interconnects, and/or inductors on the side of the substrate and dies opposite the copper plating of the second assembly of power components.

2. The system as recited in claim 1, wherein the material of the cooling layer of at least one of the first, the second, and/or the third conductor substrates is metallic.

3. The system as recited in claim 2, wherein the cooling layer of at least one of the first, the second, and/or the third conductor substrates is an assembly of two separate layers, wherein the cooling channels of at least one of the first, the second, and/or the third conductor substrates are defined only part way through one or both of the separate layers, of the respective cooling layer.

4. The system as recited in claim 3, wherein each of the plurality of cooling channels of at least one of the first, the second, and/or the third conductor substrates includes an epoxy encased heat pipe electrically insulated from the material of the cooling layer of at least one of the first, the second, and/or the third conductor substrates.

5. The system as recited in claim 2, wherein the material of the cooling layer of at least one of the first, the second, and/or the third conductor substrates is molybdenum.

6. The system as recited in claim 1, wherein for each of the first, the second and the third conductor substrate, the first metal layer, the second metal layer, and the cooling layer of the respective conductor substrate are a direct bonded copper (DBC) wherein the cooling layer for each of the first, the second and the third conductor substrate is of a ceramic material.

7. The system as recited in claim 6, wherein for each of the first, the second and the third conductor substrate, a via is formed through the cooling layer of the respective conductor substrate to electrically connect the first metal layer to the second metal layer of the respective conductor substrate, wherein the via is spaced apart from the plurality of cooling channels of the respective conductor substrate by the material of the cooling layer of the respective conductor substrate wherein the via is spaced apart from the plurality of cooling channels by the material of the cooling layer.

8. The system as recited in claim 1, wherein for the first assembly of power components each of the dies includes a respective source, a respective drain, and a respective gate, wherein the drains are on a side of the dies electrically connected to the copper plating, and wherein the gates and the sources of the dies are on a side of the dies opposite the copper plating electrically connected to the second metal layer of the second conductor substrate, and wherein for the second assembly of power components each of the dies includes a respective source, a respective drain, and a respective gate, wherein the drains are on a side of the dies electrically connected to the copper plating, and wherein the gates and sources of the dies are on a side of the dies opposite the copper plating electrically connected to the second metal layer of the third conductor substrate.

9. The system as recited in claim 8, wherein the dies of the first and the second assemblies of power components are electrically connected to form a boost converter circuit, wherein the dies of the first assembly of power components form a first switching component (SI) of the boost converter circuit, and wherein the dies of the second assembly of power components form a second switching component (SU) of the boost converter circuit.

10. The system as recited in claim 9, further comprising:
a dvr contact electrically connected to the gates of the first assembly of power components;
a ground reference contact electrically connected to provide a reference to a gate driver chip; and
a gate driver power supply contact electrically connected to supply a voltage to the gate driver chip,
wherein the first conductor substrate is connected as a voltage out contact for the boost converter circuit,
wherein the second conductor substrate is connected as a voltage in contact for the boost converter circuit,
wherein the third conductor substrate is connected as a ground contact for the boost converter circuit.

11. A system, comprising:
a first assembly of power components including dies integrated into a substrate with a copper plating on one side of the substrate in electrical communication with the dies,
a first conductor substrate with embedded cooling channels including a first metal layer, a second metal layer, and a cooling layer, wherein the copper plating of the first assembly of power components is in contact with the first metal layer,
a second conductor substrate with embedded cooling channels including a first metal layer, a second metal layer, and a cooling layer, wherein the second metal layer of the second conductor substrate is in electrical contact with at least one of vertical interconnects, lateral interconnects, and/or inductors on the side of the substrate and dies opposite the copper plating of the first assembly of power components, a second assembly of power components including dies integrated into a second substrate with a second copper plating on one side of the second substrate in electrical communication with the dies, wherein the second copper plating of the second power assembly is in contact with the first metal layer of the second conductor substrate; and a third conductor substrate with embedded cooling channels including a first metal layer, a second metal layer, and a cooling layer, wherein the second metal layer of the third conductor substrate is in electrical contact with at least one of vertical interconnects, lateral interconnects, and/or inductors formed on a side of the substrate and the dies opposite the copper plating of the second assembly of power components.

12. The system of claim 11, wherein for each of the first, the second, and the third conductor substrates with embedded cooling channels, the embedded cooling channels include a plurality of cooling channels embedded in a material of the respective cooling layer, wherein the plurality of cooling channels are spaced apart from both the respective first metal layer and the respective second metal layer by the material of the respective cooling layer, wherein a respective electrically conductive path connects the respective first metal layer to the respective second metal layer.

13. The system of claim 12, wherein the material of the respective cooling layer is metallic.

14. The system of claim 12, wherein the material of the respective cooling layer is ceramic.

15. The system of claim 12, wherein each of the plurality of cooling channels of the respective conductor substrates includes an epoxy encased heat pipe electrically insulated from the material of the respective cooling layer.

\* \* \* \* \*